(12) United States Patent
Then et al.

(10) Patent No.: US 11,107,764 B2
(45) Date of Patent: Aug. 31, 2021

(54) GROUP III-V SEMICONDUCTOR FUSES AND THEIR METHODS OF FABRICATION

(71) Applicant: Intel Corporation, Santa Clara, CA (US)

(72) Inventors: Han Wui Then, Portland, OR (US); Marko Radosavljevic, Portland, OR (US); Sansaptak Dasgupta, Hillsboro, OR (US); Tristan A. Tronic, Aloha, OR (US); Rajat K. Paul, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 16/629,936

(22) PCT Filed: Sep. 28, 2017

(86) PCT No.: PCT/US2017/054185
§ 371 (c)(1),
(2) Date: Jan. 9, 2020

(87) PCT Pub. No.: WO2019/066879
PCT Pub. Date: Apr. 4, 2019

(65) Prior Publication Data
US 2020/0357742 A1    Nov. 12, 2020

(51) Int. Cl.
*H01L 23/525* (2006.01)
*H01L 29/20* (2006.01)
*H01L 29/78* (2006.01)

(52) U.S. Cl.
CPC ...... *H01L 23/5256* (2013.01); *H01L 29/2003* (2013.01); *H01L 29/78* (2013.01)

(58) Field of Classification Search
CPC .......... H01L 23/5252; H01L 27/11206; H01L 23/525; H01L 23/5256; H01L 23/62; H01L 29/2003; H01L 29/78
(Continued)

(56) References Cited

U.S. PATENT DOCUMENTS 5,913,138 A    6/1999  Yamaoka et al.
8,384,131 B2   2/2013  Lee et al.
(Continued)

FOREIGN PATENT DOCUMENTS

JP    2013-157468    8/2013
KR    10-2009-0014824  2/2009
WO    WO 2015/122877   8/2015

OTHER PUBLICATIONS

International Preliminary Report on Patentability for International Patent Application No. PCT/US2017/054185, dated Apr. 9, 2020, 8 pgs.
(Continued)

*Primary Examiner* — Jonathan Han
(74) *Attorney, Agent, or Firm* — Schwabe, Williamson & Wyatt, P.C.

(57) ABSTRACT

Group III-V semiconductor fuses and their methods of fabrication are described. In an example, a fuse includes a gallium nitride layer on a substrate. An oxide layer is disposed in a trench in the gallium nitride layer. A first contact is on the gallium nitride layer on a first side of the trench, the first contact comprising indium, gallium and nitrogen. A second contact is on the gallium nitride layer on a second side of the trench, the second side opposite the first side, the second contact comprising indium, gallium and nitrogen. A filament is over the oxide layer in the trench, the
(Continued)

filament coupled to the first contact and to the second contact wherein the filament comprises indium, gallium and nitrogen.

25 Claims, 10 Drawing Sheets

(58) Field of Classification Search
USPC .... 257/76, 50, 530, E23.147, 209, 528–529, 257/665; 438/467, 132, 215, 281, 333, 438/601
See application file for complete search history.

(56) References Cited

U.S. PATENT DOCUMENTS

| | | | |
|---|---|---|---|
| 9,589,971 | B1 * | 3/2017 | Chang .................... H01L 28/00 |
| 9,799,601 | B1 * | 10/2017 | Hsu .................... H01L 23/5258 |
| 2008/0237786 | A1 | 10/2008 | Yang et al. |
| 2009/0051002 | A1 | 2/2009 | Booth, Jr. et al. |
| 2009/0108396 | A1 | 4/2009 | Chidambarrao |
| 2010/0025819 | A1 | 2/2010 | Domenicucci et al. |
| 2010/0096722 | A1 * | 4/2010 | Kim .................... H01L 23/5258 257/529 |
| 2011/0241086 | A1 * | 10/2011 | Kurz .................... H01L 23/5256 257/288 |
| 2016/0049367 | A1 | 2/2016 | Rou et al. |

OTHER PUBLICATIONS

International Search Report and Written Opinion for International Patent Application No. PCT/US2017/054185 dated Jun. 28, 2018, 13 pgs.

Search Report from European Patent Application No. 17926938.6 dated Apr. 1, 2021, 10 pgs.

* cited by examiner

GROUP III-V SEMICONDUCTOR FUSES AND THEIR METHODS OF FABRICATION

CROSS-REFERENCE TO RELATED APPLICATION

This patent application is a U.S. National Phase Application under 35 U.S.C. § 371 of International Application No. PCT/US2017/054185, filed Sep. 28, 2017, entitled "GROUP III-V SEMICONDUCTOR FUSES AND THEIR METHODS OF FABRICATION," which designates the United States of America, the entire disclosure of which is hereby incorporated by reference in its entirety and for all purposes.

TECHNICAL FIELD

Embodiments of the present disclosure relate to semiconductor integrated circuits and more particularly to group III-V semiconductor fuses and their methods of fabrication.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. As the dimensions of fundamental building blocks of microelectronic circuitry are reduced and as the sheer number of fundamental building blocks fabricated in a given region is increased, the constraints on the semiconductor processes used to fabricate these building blocks have become overwhelming. In particular, there may be a trade-off between the smallest dimension of a feature patterned in a semiconductor stack (the critical dimension) and the spacing between such features. Additionally, the constraints on including passive features among active devices have increased.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIG. 2A illustrates a III-V semiconductor layer formed over a substrate;

FIG. 2B illustrates the structure of FIG. 2A following formation of shallow trench isolation regions;

FIG. 2C illustrates the formation of a sacrificial gate and a seed layer on the structure of FIG. 2B;

FIG. 2D illustrates the formation of a hard mask over the transistor region of the structure of FIG. 2C;

FIG. 2E illustrates the formation of recesses in the structure of FIG. 2D;

FIG. 2F illustrates the formation of a source region, and drain region, a first contact and a second contact on the structure of FIG. 2E;

FIG. 2G illustrates the formation of an interlayer dielectric over the structure of FIG. 2F and the removal of the sacrificial gate structure from the structure of FIG. 2F; and FIG. 2H illustrates the formation of a gate stack on the structure of FIG. 2G.

DESCRIPTION OF THE EMBODIMENTS

Figure 1A:
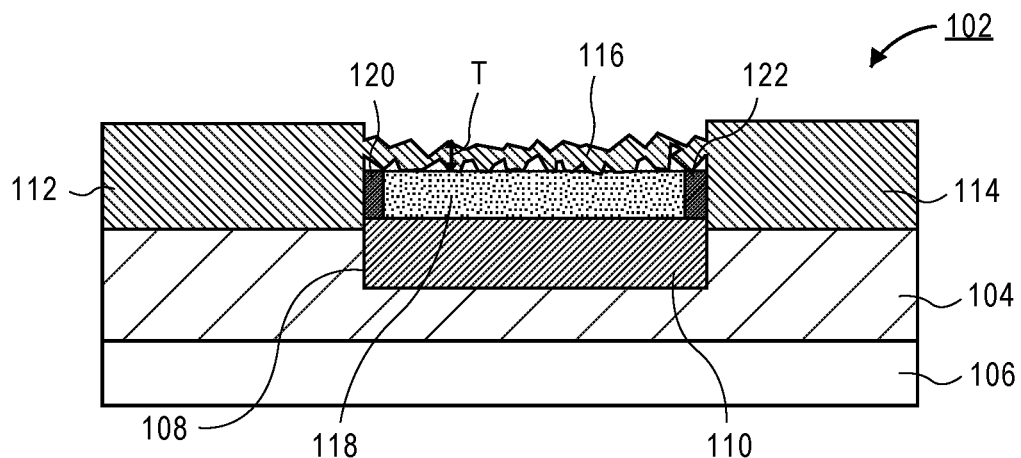
FIG. 1A and FIG. 1B illustrate a III-V fuse in accordance with an embodiment of the present disclosure.

Group III-V semiconductor fuses and their methods of fabrication are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

Embodiments of the present disclosure are directed to III-V semiconductor fuses and their methods of fabrication. In embodiments, a fuse includes a III-V semiconductor layer, such as gallium nitride (GaN), formed over a substrate, such as a silicon monocrystalline substrate. An oxide layer is located in a trench in the III-V semiconductor layer. The fuse further includes a first contact located on the III-V semiconductor layer on a first side of the trench and a second contact located on the III-V semiconductor layer on a second side of the trench, wherein the first side of the trench is opposite to the second side of the trench. In an embodiment, the first and second contacts are formed from a III-V semiconductor, such as indium, gallium and nitrogen (InGaN). In an embodiment, the first and second contacts are formed of a III-V semiconductor which is different than the III-V semiconductor layer in which the trench is formed. In an embodiment, the first and second contacts are single crystalline. A filament is disposed above the oxide layer in the trench and is in contact with the first and second contacts. In an embodiment, the filament is an III-V semiconductor and has a polycrystalline structure. In an embodiment, the first and second contact and the filament are N+ doped.

A III-V semiconductor fuse is not based on thermally accelerated metal electromigration and, as such may not require very thin and narrow metal interconnects as necessary with conventional metal fuses. In embodiments of the present disclosure, the fuse may be used as a programmable, read only memory to burn in calibration data, such as bias offsets, bias temperature compensation, and/or temperature sensor offsets. The fuse may also be used to store manufacturing identification (ID) information.

In embodiments of the present disclosure, the fuse may be fabricated alongside and simultaneous with a III-V semiconductor transistor, such as a GaN transistor, formed on the III-V layer disposed over the substrate. In an embodiment, a source/drain regrowth module used to form source and drain regions for a III-V transistor is also used to create the first contact, the second contact and the filament of the III-V fuse. In an embodiment, a patterned polycrystalline film used to form a sacrificial gate electrode for the III-V transistor is also used to form a seeding material for the filament of the III-V semiconductor fuse. In an embodiment of the present disclosure, the state of the fuse or the states of a plurality of fuses is/are used to control or determine the bias voltage applied to the III-V transistor.

Figure 1B:
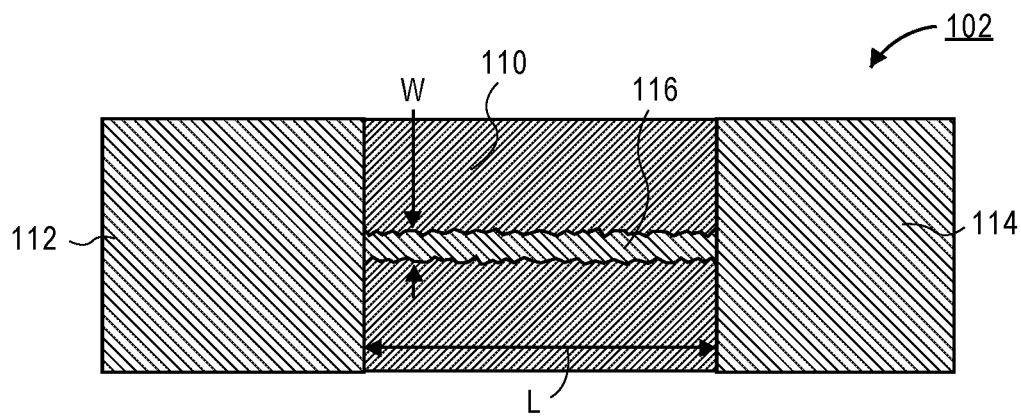

FIG. 1A and FIG. 1B illustrate a III-V fuse 102 in accordance with an embodiment of the present disclosure. FIG. 1A is a cross-sectional view of fuse 102 while FIG. 1B is an overhead view of fuse 102. In an embodiment, fuse 102 is disposed over a group III-V semiconductor layer on a substrate 106, such as a monocrystalline silicon substrate. In an embodiment, group III-V semiconductor layer 104 is a group III nitride semiconductor and in a specific embodiment may be GaN. A trench 108 is formed in III-V semiconductor layer 104. An oxide layer 110 is disposed in the trench 108. A first contact 112 is located on a first side of trench 108 and a second contact 114 is located on a second side of trench 108 wherein the second side is opposite the first side. The first contact 112 and the second contact 114 are a III-V semiconductor, such as indium gallium nitride ($In_xGa_{1-x}N$, $0<x<1$). In an embodiment, first contact 112 and the second contact 114 are a different group III-V semiconductor than the group III-V semiconductor layer 104. In an embodiment of the present disclosure, the first contact 112 and second contact 114 are formed from indium gallium nitride (InGaN) semiconductor, and the group III-V semiconductor of layer 104 is a gallium nitride (GaN) layer. In an embodiment of the present disclosure, first contact 112 and second contact 114 have a single crystalline or near single crystalline structure. In an embodiment of the present disclosure, first contact 112 and second contact 114 are formed in recesses disposed in the group III-V semiconductor layer 104 so that the bottom of first contact 112 and second contact 114 are beneath the top surface of oxide layer 110.

A filament 116 is disposed above oxide layer 110 in trench 108 and is in direct electrical and physical contact with first contact 112 and second contact 114. Oxide layer 110 isolates filament 116 from III-V semiconductor layer 104. Filament layer 116 has a length (L), a width (W), and a thickness (T) as illustrated in FIGS. 1A and 1B. In an embodiment, filament 116 is a group III-V semiconductor, such as indium, gallium nitride ($In_xGa_{1-x}N$ $0<x<1$). In an embodiment, the filament 116 has a polycrystalline grain structure. In an embodiment, first contact 112, second contact 114, and filament 116 each have an N+ conductivity, e.g., greater than 1E18 atoms/cm$^3$. In an embodiment, filament 116 is a same material as the first contact 112 and second contact 114. In another embodiment, filament 116 is a different material than the first contact 112 and second contact 114.

In an embodiment, fuse 102 includes a seed layer 118 located between filament layer 116 and oxide layer 110. Filament 116 may be disposed directly on seed layer 118 and seed layer 118 may be disposed directly on oxide layer 110. In an embodiment, seed layer 118 is a polycrystalline film, such as but not limited polycrystalline silicon or polycrystalline silicon germanium. In an embodiment, seed layer 118 is undoped or only lightly doped. In an embodiment, fuse 102 includes a first insulating sidewall spacer 120 located between a first side of seed layer 118 and first contact 112 and a second insulating sidewall spacer 122 located between a second side of seed layer 118 and second contact 114 as illustrated in FIG. 1A. Sidewall spacers 120 and 122 isolate seed layer 118 from first contact 112 and second contact 114, respectively. Insulating sidewall spacers 120 and 122 may be formed from an insulating material, such as but not limited to silicon oxide, silicon oxynitride, and silicon nitride.

In an alternative embodiment, filament 116 is formed directly on oxide layer 116. In such an embodiment, a groove or a trench patterned in oxide layer 116 may act as a seeding structure for filament 116.

Figure 1C:
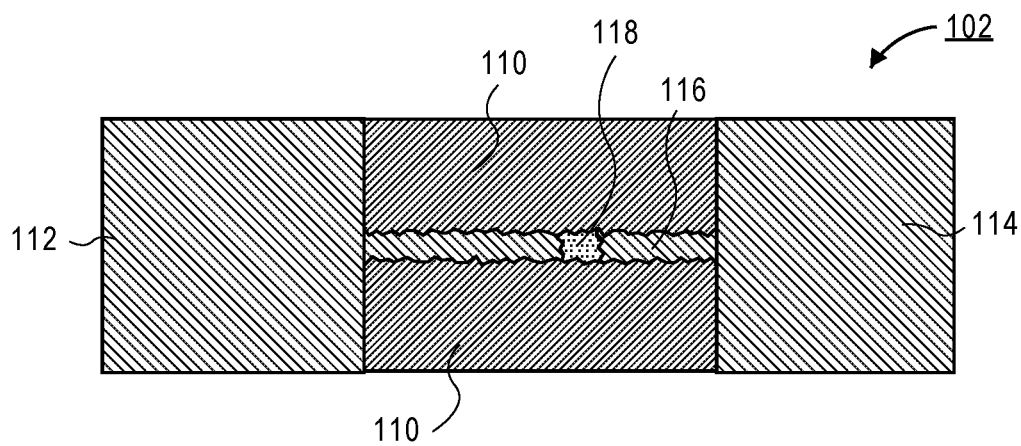
FIG. 1C illustrates a fuse which is in an open state or a "blown" state in accordance with an embodiment of the present disclosure.

Fuse 102 has two states, a first low resistive state and a second open or highly resistive state. The low resistive state is shown in FIGS. 1A and 1B where filament 116 is continuous and unbroken between first contact 112 and second contact 114. The resistive value of fuse 102 in the low resistive state is largely determined by the width, thickness, and length of filament 116. Fuse 102 has a second state which is an open state or a "blown" state wherein the fuse has a void or opening formed completely through filament 116 as illustrated in FIG. 1C so that current does not flow through the filament 116 between first contact 112 and second contact 114 when a voltage is placed between first contact 112 and second contact 114. Fuse 102 can be programmed from a low resistive state to an open state or a "blown" by applying a sufficiently large current or voltage between first contact 112 and second contact 114 so that filament 116 is blown.

In an embodiment, substrate 106 includes a plurality of fuses 102, such as several hundred fuses 102, to provide a non-programmable memory to store information, such as but not limited to calibration information, bias offset information and manufacturing identification information for circuits fabricated on substrate 102.

FIGS. 2A-2H illustrate cross-sectional views of a method of fabricating a III-V semiconductor fuse and a III-V semiconductor transistor in accordance with embodiments of the present disclosure. Although embodiments of the disclosure show the fabrication of a III-V semiconductor fuse simultaneously with the fabrication of a III-V transistor, one of ordinary skill of the art will appreciate that the fuse need not be fabricated simultaneously with a transistor and may be fabricated independently.

Figure 2A:
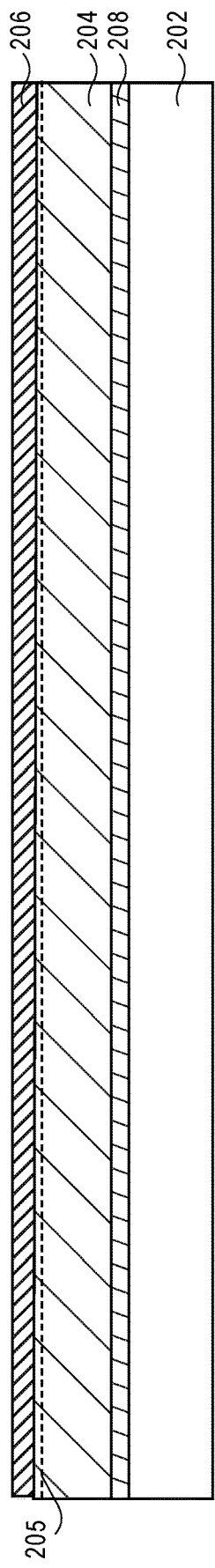
FIGS. 2A-2H illustrate cross-sectional views of a method of fabricating a III-V semiconductor fuse and a III-V semiconductor transistor in accordance with embodiments of the present disclosure, where.

FIG. 2A illustrates a III-V semiconductor layer 204 formed over a substrate 202. A polarization layer 206 may be disposed on the III-V semiconductor layer 204. Substrate 202 may be any well-known substrate used in the manufacture of integrated circuits, such as but not limited to a silicon monocrystalline substrate, a silicon carbide substrate and a sapphire substrate. In an embodiment, the III-V semiconductor layer 204 may be a semiconductor material desired to form a channel of a III-V transistor, such as GaN. III-V semiconductor layer 204, however, may be other types of III-V semiconductors, such as but not limited to InSb, GaAs, AlGaAs. In an embodiment, a buffer layer 206 may be formed between substrate 202 and III-V semiconductor layer 204. Buffer layer 206 may contain one or more layers having a lattice constant between the lattice constant of substrate 202 and III-V semiconductor layer 204. Polarization layer 208 is a III-V semiconductor, such as aluminum gallium indium nitride (AlGaInN) which is formed to a sufficient thickness to create a two dimensional electron gas (2-DEG) layer 205 in the top portion of III-V semiconductor layer 204. In an embodiment, polarization layer 208 is deposited on a (0001) plane or c-plane of a GaN layer 204.

In a specific embodiment, substrate 202 is a monocrystalline silicon substrate, buffer layer 208 includes an aluminum nitride layer disposed on the monocrystalline silicon substrate and a graded aluminum gallium nitride layer with a higher aluminum concentration near the aluminum nitride layer, and the III-V layer 204 is gallium nitride (GaN). Integrated circuits, for example, a system-on-chip (SOC) or a microprocessor, may be formed from nonplanar silicon transistors fabricated on portions of silicon substrate 202 not covered by the GaN layer 204. In another embodiment, substrate 202 is a silicon carbide (SiC) substrate, buffer layer 208 comprises aluminum nitride, and III-V semiconductor layer 204 is GaN. Polarization layer 206, buffer layer 208, III-V semiconductor layer 204 may be formed by any well-known technique, such as but not limited to chemical vapor deposition (CVD), metal organic chemical vapor deposition (MOCVD), and sputtering.

Figure 2B:
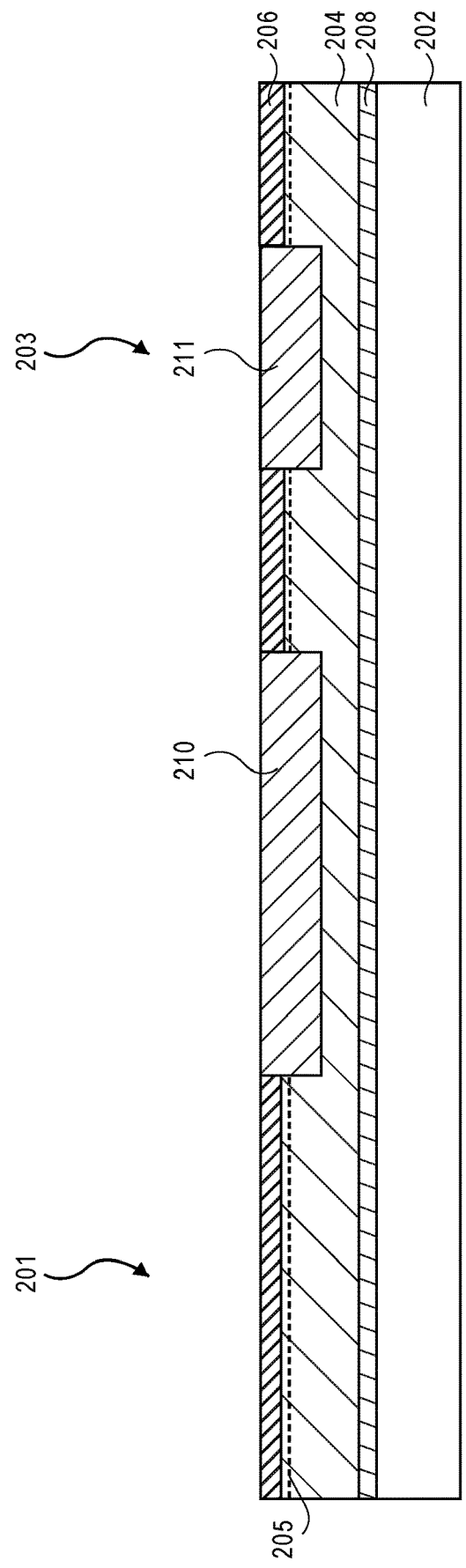

FIG. 2B illustrates the formation of shallow trench isolation (STI) regions 210 and 211 in the structure of FIG. 2A. STI region 210 separates a transistor region 201 from a fuse region 203. A shallow trench isolation region 211 is disposed in fuse region 203. STI regions 210 and 211 may be formed by etching trenches through polarization layer 206 and into III-V layer 204 and the blanket depositing an insulating film, such as silicon oxide, to fill the trenches. A chemical mechanical polishing (CMP) process may then be used to remove excess insulating material from above polarization layer 206 so that STI regions 210 and 211 are substantially coplanar with the top surface of polarization layer 206 as shown in FIG. 2B.

Figure 2C:
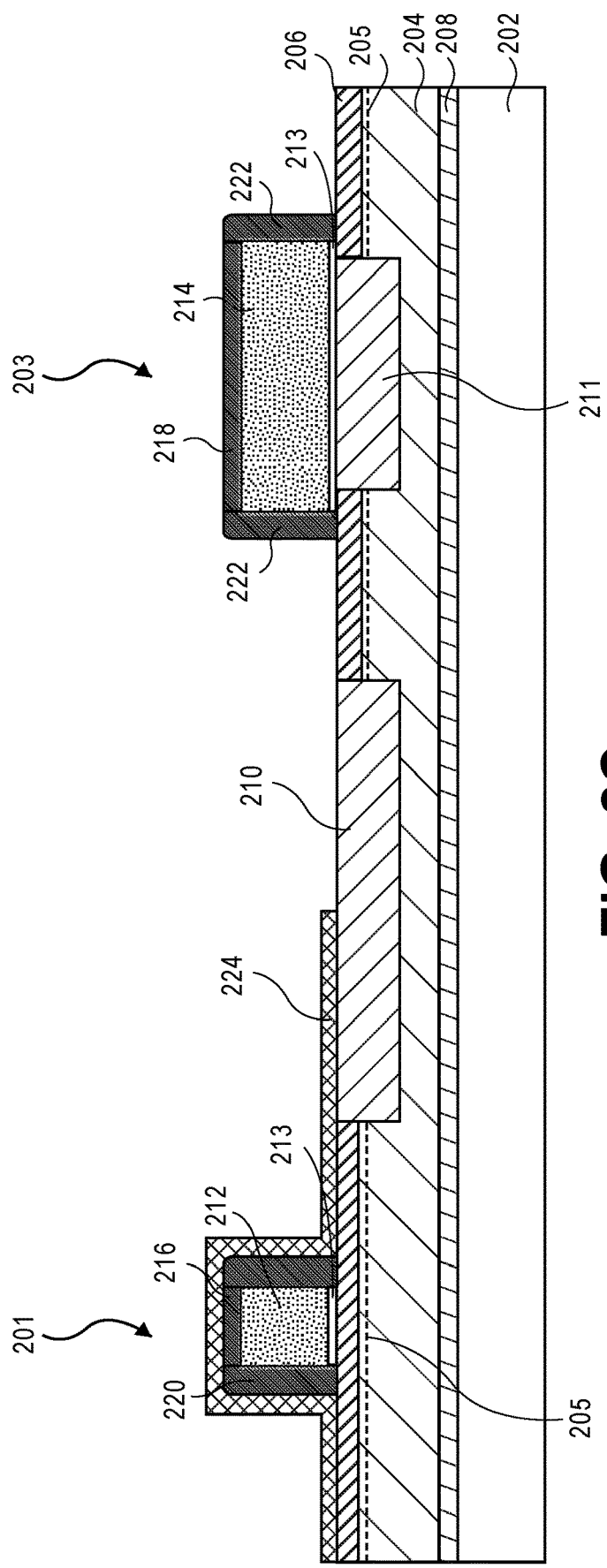

FIG. 2C illustrates the formation of a sacrificial gate 212 and a seed layer 214 on the structure of FIG. 2B. Sacrificial gate 212 is formed over polarization layer 206 and substrate 204 in transistor region 201, and seed layer 214 is formed over STI region 211 in fuse region 203. In an embodiment, seed layer 214 also extends over the polarization layer 206 of III-V semiconductor layer 204 on either side of STI region 211 as shown in FIG. 2C. A sacrificial gate dielectric 213, such as silicon dioxide, may be formed beneath sacrificial gate 212 and seeding layer 218 as shown in FIG. 2C if desired. A cap 216 may be formed on the top of sacrificial gate 212 and a cap 218 may be formed on the top of seed layer 214. A pair of insulating sidewall spacers 220 may be formed along opposite walls of sacrificial gate 212 and a pair of insulating sidewalls spacers 222 may be formed along opposite sidewalls of seed layer 214.

Sacrificial gate 212/cap 216 and seed layer 214/cap 218 may be formed by first blanket depositing a polycrystalline film, such as but not limited to polycrystalline silicon by, for example, chemical vapor deposition (CVD) or sputtering over the structure of FIG. 2B. A capping layer, such as but not limited to silicon nitride, silicon carbide, or silicon oxynitride may be deposited over the polycrystalline film. The stack of films can then be patterned by well-known techniques, such as lithographic masking and etching, to form sacrificial gate 212/cap 216 and seeding layer 214/cap 218. It is to be appreciated that when the polycrystalline film is patterned to create seed layer 218, the patterning generally sets the length (L) and width (W) for the subsequently deposited filament of the fuse. Insulating sidewall spacers 220 and 222 may then be formed by blanket depositing an insulating film, such as but not limited to silicon oxide, silicon oxynitride, and silicon nitride over sacrificial gate 212/cap 216 and seed layer 214/cap 218 and then anisotropically etching the insulating film, as is well-known in the art.

Figure 2D:
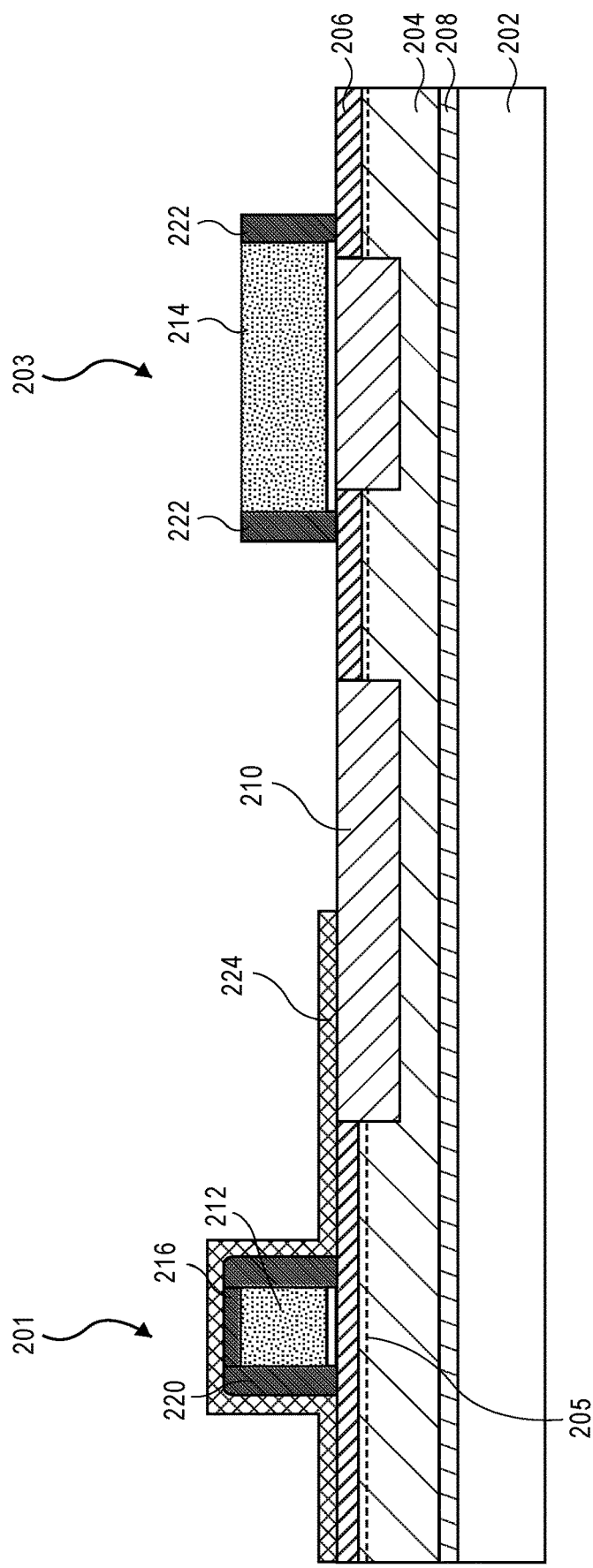

FIG. 2D illustrates the formation of a hard mask 224 over the structure of FIG. 2C and the removal of cap 218 from seed layer 214. Hard mask 224 is formed over transistor region 201 of substrate 202. Hard mask 224 may be formed by blanket depositing a hard mask material, such as but not limited to silicon dioxide, silicon nitride, and silicon oxynitride over the substrate of FIG. 2C. The hard mask material is then patterned by, for example, lithographic masking and etching, to form hard mask 224 formed over sacrificial gate 212/cap 216 and spacers 220 and over polarization layer 206 in transistor region 201. The hard mask material is removed from over fuse region 203 as illustrated in FIG. 2D. Next, cap 218 is removed from seed layer 214 by, for example, etching. Hard mask 224 protects capping layer 216 from etching during the removal of cap 218. In an embodiment, hard mask 224 is formed of a material which is not etched, or only slightly etches, when exposed to the etchant used to remove cap 218.

Figure 2E:
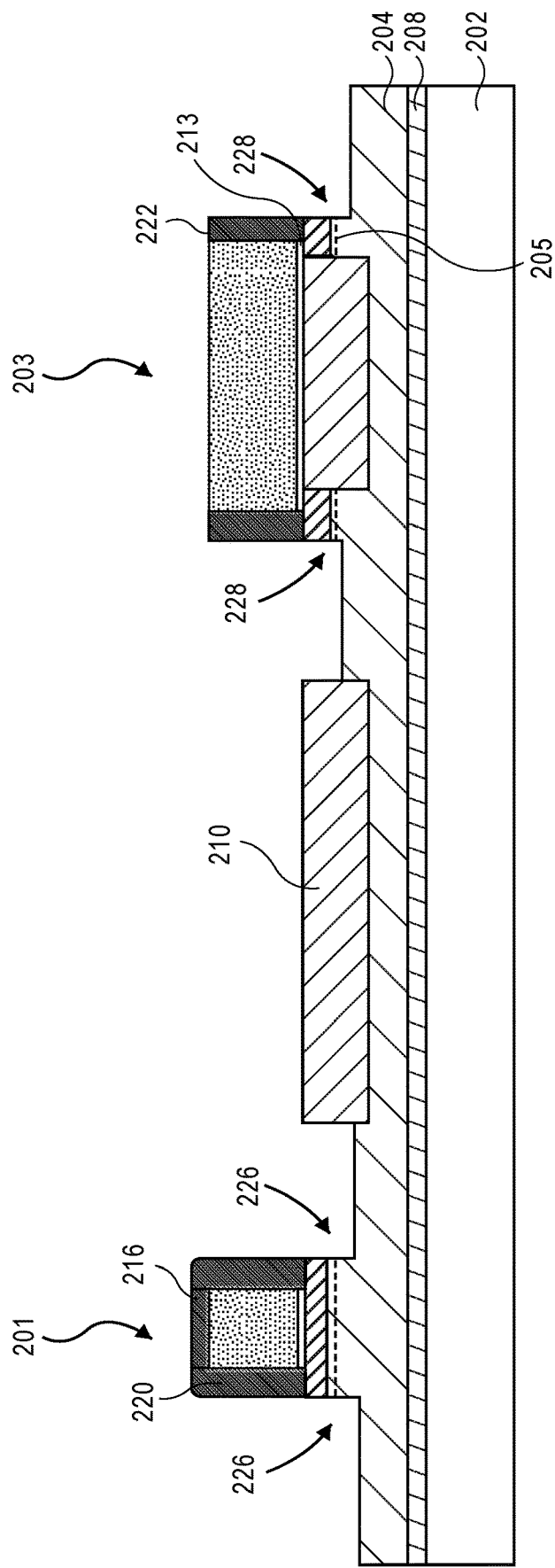

FIG. 2E illustrates the removal of hard mask 224 and the formation of recesses in the structure of FIG. 2D. In an embodiment, recesses 226 are formed on opposite sides of sacrificial gate 226 as illustrated in FIG. 2E. Recesses 226 are formed through polarization layer 206 and into III-V semiconductor layer 204. Recess 226 may enable a subsequently deposited source/drain material to provide stressing to a channel region of a transistor fabricated in region 201. Recesses 226 may be formed by wet etching, dry etching or a combination of wet and dry etching. In an embodiment, the etching process used to form recesses 226 also forms recesses 228 on opposite sides of seed layer 214 as illustrated in FIG. 2E.

Figure 2F:
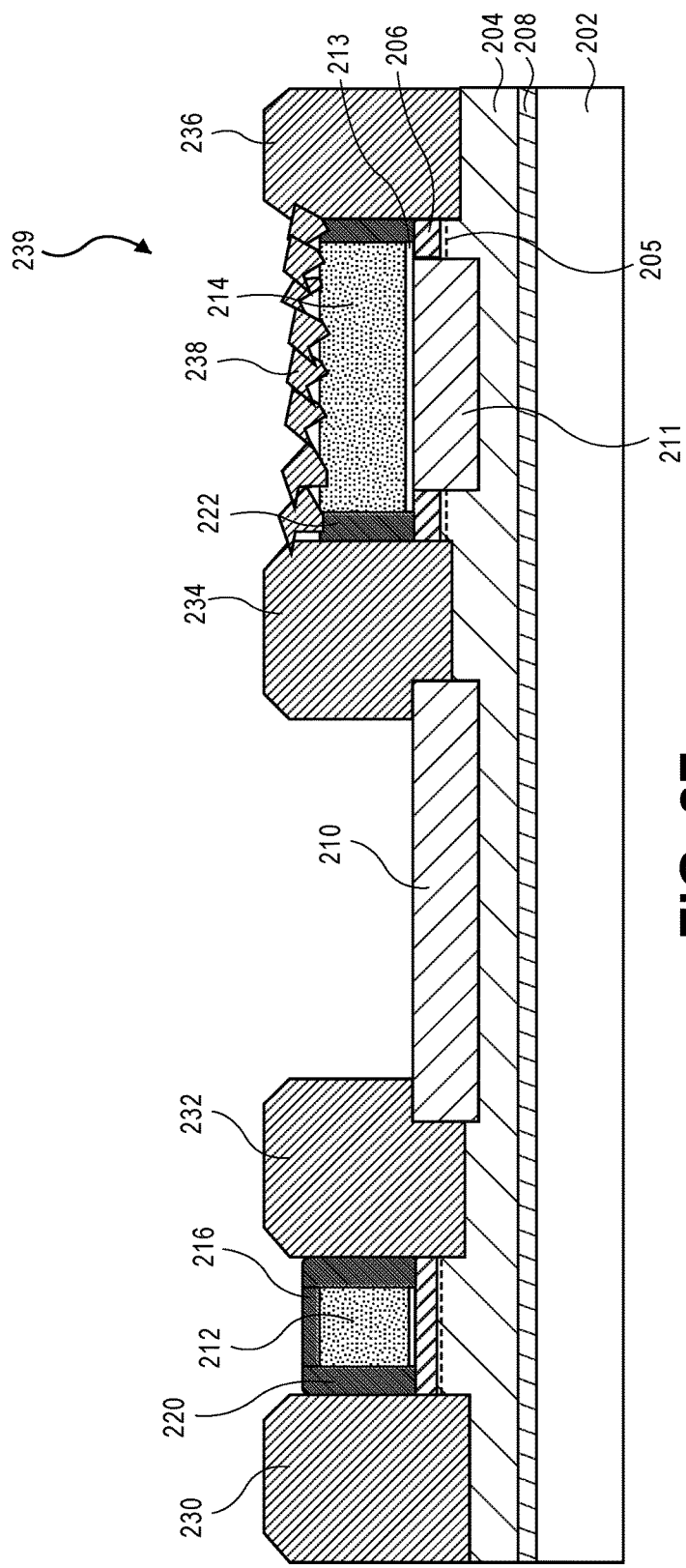

FIG. 2F is a cross-sectional view illustrating the formation of a source region, and drain region, a first contact and a second contact on the structure of FIG. 2E. In an embodiment, a source region 230 is formed in recess 226 on a first side a sacrificial gate 212 and a drain 232 is formed in recess 226 on a second side of sacrificial gate 212 as illustrated in FIG. 2F. Additionally, a first contact 234 is formed in a recess 228 on a first side of seed layer 214 and a second contact 236 is formed into recess 228 on a second side of seed layer 214. In an embodiment, source region 230, drain region 232, first contact 234 and second contact 236 are formed from a III-V semiconductor, such as indium gallium nitride (InGaN). In an embodiment, source region 230, drain region 232, first contact 234 and second contact 236 are formed from a III-V semiconductor material which is different from a III-V semiconductor material of III-V semiconductor layer 204. In an embodiment, the III-V semiconductor material used to form source region 230, drain region 232, first contact 234 and second contact 236 has a smaller band gap than the semiconductor used to form III-V semiconductor layer 204. In an embodiment, the source region 230, drain region 232, first contact 234, and second contact 236 are formed from a single crystalline III-V semiconductor and may be N+ doped with a dopant such as silicon. In an embodiment, a III-V semiconductor material is selectively deposited by, for example, chemical vapor deposition so that the III-V semiconductor material selectively forms on semiconductor regions, such as III-V semiconductor layer 204 in recesses 226 and 228 and on polycrystalline seed layer 214 but does not form on insulating surfaces, such as STI oxide 210 and cap 216. In an embodiment, the deposition process is continued until recesses 226 and 228 are completely filled with III-V semiconductor material.

Additionally, in an embodiment of the present disclosure, the deposition process continues until the top surface of source region 230 and drain region 232 extend above the surface upon which sacrificial gate 212 is formed in order to create raised source region 230 and raised drain region 232, which may be in situ doped with for example silicon to N+ conductivity. Additionally, in an embodiment, the deposition process continues until a sufficiently thick and continuous polycrystalline III-V semiconductor layer is formed over polycrystalline seed layer 214 to create a filament 238. In an embodiment, the deposition process used to form source region 230, drain region 232, first contact 234 and second contact 236 selectively epitaxially deposits a single crystalline or near single crystalline film. However, because seed layer 214 is polycrystalline, the deposition process forms a polycrystalline III-V semiconductor film on polycrystalline seed layer 214 resulting in a polycrystalline filament 238. Additionally, it is to be appreciated that sidewall spacers 232 are also formed on the front and back surfaces (in and out of the page) of seed layer 214 so that the deposition process does not form III-V semiconductor material on the front and back surfaces of seed layer 214. Lateral overgrowth enables the polycrystalline filament 238 and a single crystalline film of the first and second contacts to extend over the spacers 222 so that filament 238 is electrically and physically connected to first contact 234 and second contact 236 as illustrated in FIG. 2F. At this time the process of fabricating a III-V fuse 239 in accordance with embodiments of the present disclosure is complete. In an embodiment, as shown in FIG. 2F, fuse 239 includes polarization layer 206 between first contact 234 and STI oxide 211 and between second contact 236 and STI oxide 211. The polarization layer may create a 2DEG layer 205 in top surface of III-V layer 204.

Figure 2G:
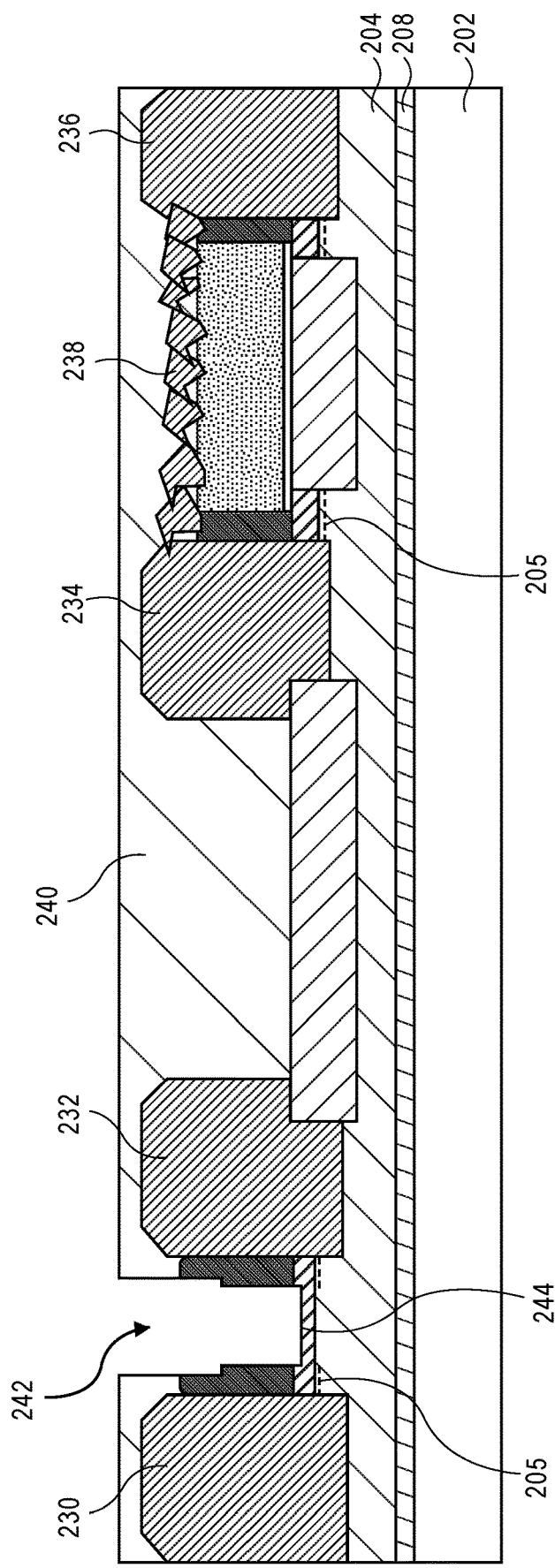

FIG. 2G illustrates the formation of an interlayer dielectric over the structure of FIG. 2F and the removal of cap 216 and sacrificial gate structure 212 from the structure of FIG. 2F. In an embodiment, an interlayer dielectric layer is first blanket deposited over the structure of FIG. 2F. The interlayer dielectric may be deposited by any well-known technique, such as for example, chemical vapor deposition or plasma enhanced chemical vapor deposition. In an embodiment, the interlayer dielectric is an oxide, such as but not limited to, silicon oxide, and carbon doped silicon oxide. The ILD is deposited to a thickness sufficiently to cover source region 230, drain region 232, first contact 234, second contact 236 and filament 238. The ILD layer may then be chemically mechanically polished in order to create a planar top surface as illustrated in FIG. 2G. Next, the interlayer dielectric 240 may be patterned to create an opening 242 above cap 216 and sacrificial gate 212. Cap 216 and sacrificial gate 212 may then be removed by, for example, etching as illustrated in FIG. 2G. In an embodiment, the polarization layer 206 in the opening 242 is then partially etched to create a recessed polarization layer 244 such that the 2-DEG effect is removed. In another embodiment, the polarization layer 206 in the opening 242 is completely removed to expose the III-V material layer 204.

Figure 2H:
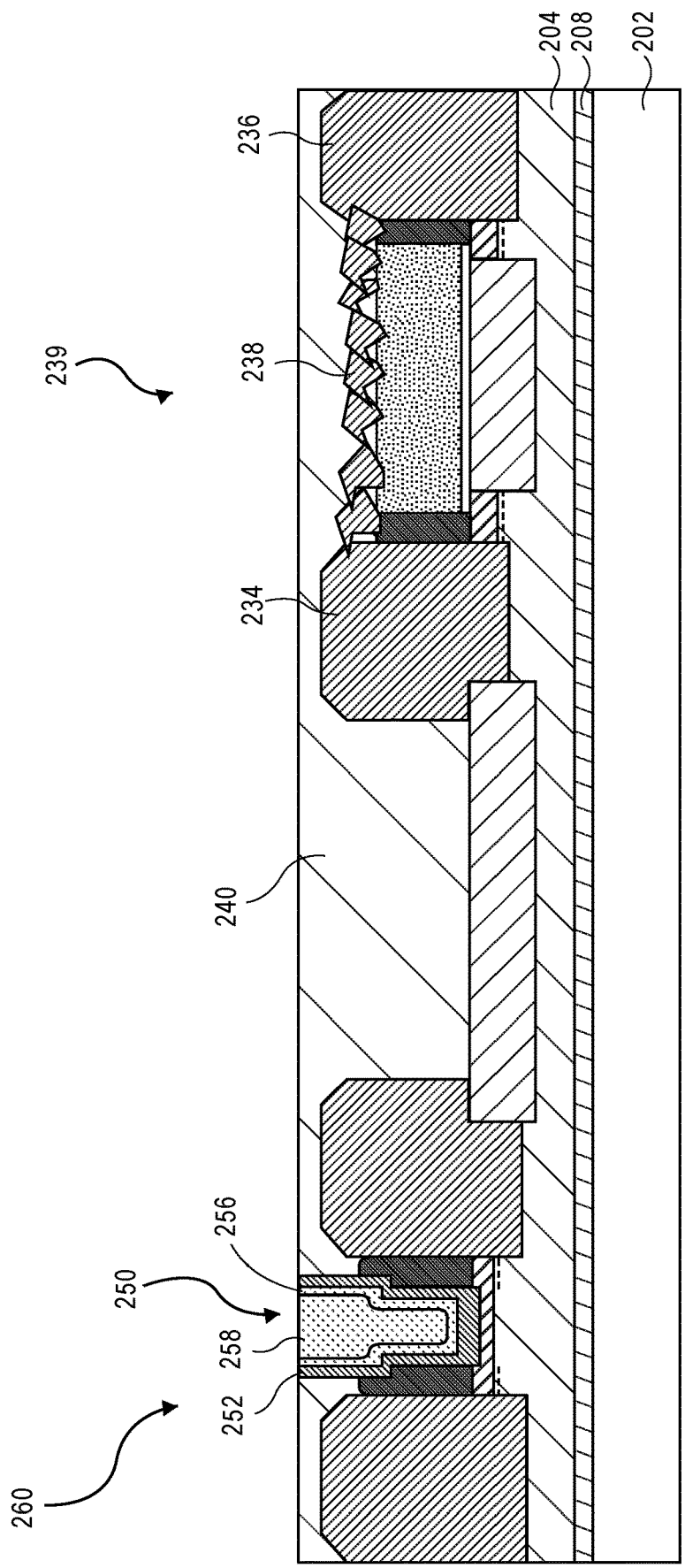

FIG. 2H illustrates the formation of a gate on the structure of FIG. 2G. In an embodiment of the present disclosure, the gate stack 250 is disposed in opening 242. In an embodiment of the present disclosure, gate stack 250 includes a high-k gate dielectric 252 disposed on recessed polarization layer 244 or on III-V semiconductor layer 204 if polarization layer is completely removed during etching. Gate stack 250 includes a metal gate 254. In an embodiment, metal gate 254 includes a work function layer or layers 256 and a fill layer 258. At the time the process of fabricating a III-V transistor 260 in accordance with embodiments of the present invention is not complete. It is to be appreciated that fuse 239 has been fabricated along side III-V transistor 260 while adding only one additional masking step.

In an alternative embodiment, the polycrystalline film used to form sacrificial gate 212 is completely removed from the fuse region 203 during the processing of FIG. 2D so that seed layer 214 is not formed in STI oxide layer 211. During the formation of STI oxide 211 in FIG. 2B, a groove may develop in oxide 211 between the first contact 234 and the second contact 236. The groove may act as a seed structure to create filament 238 during deposition of first contact 234 and second contact 236. In this way, filament 238 may be deposited directly on STI oxide 211. Alternatively, a trench may be patterned in oxide 211 to provide a seeding structure for filament 238

Implementations of embodiments of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (Sift), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 3:
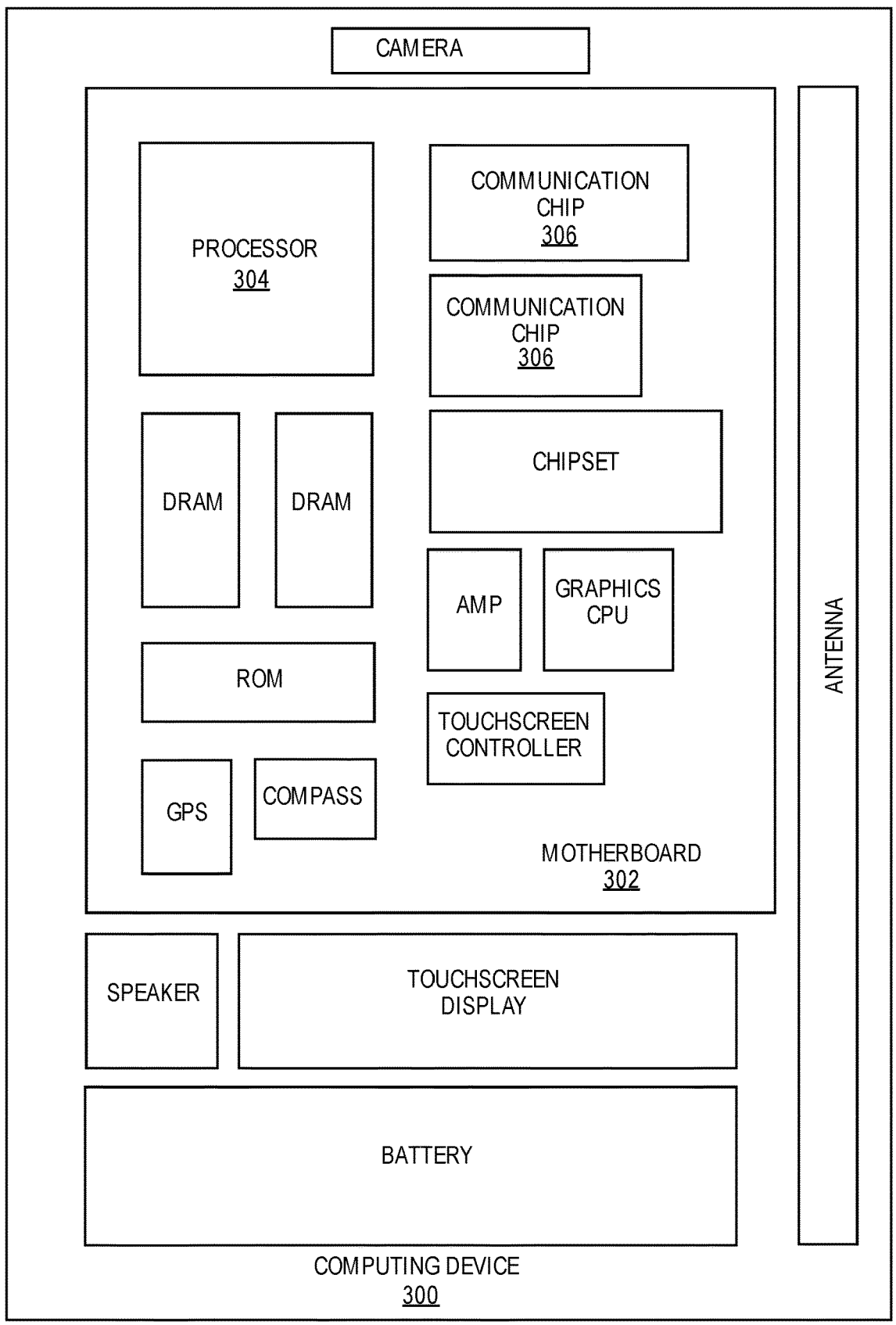
FIG. 3 illustrates a computing device in accordance with one implementation of the disclosure.

FIG. 3 illustrates a computing device 300 in accordance with one implementation of the disclosure. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the disclosure, the integrated circuit die of the processor includes one or more devices, such as to group III-V semiconductor fuses built in accordance with implementations of the disclosure. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the disclosure, the integrated circuit die of the communication chip includes one or more devices, such as to group III-V semiconductor fuses built in accordance with implementations of the disclosure.

In further implementations, another component housed within the computing device 300 may contain an integrated circuit die that includes one or more devices, such as to group III-V semiconductor fuses built in accordance with implementations of the disclosure.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 4:
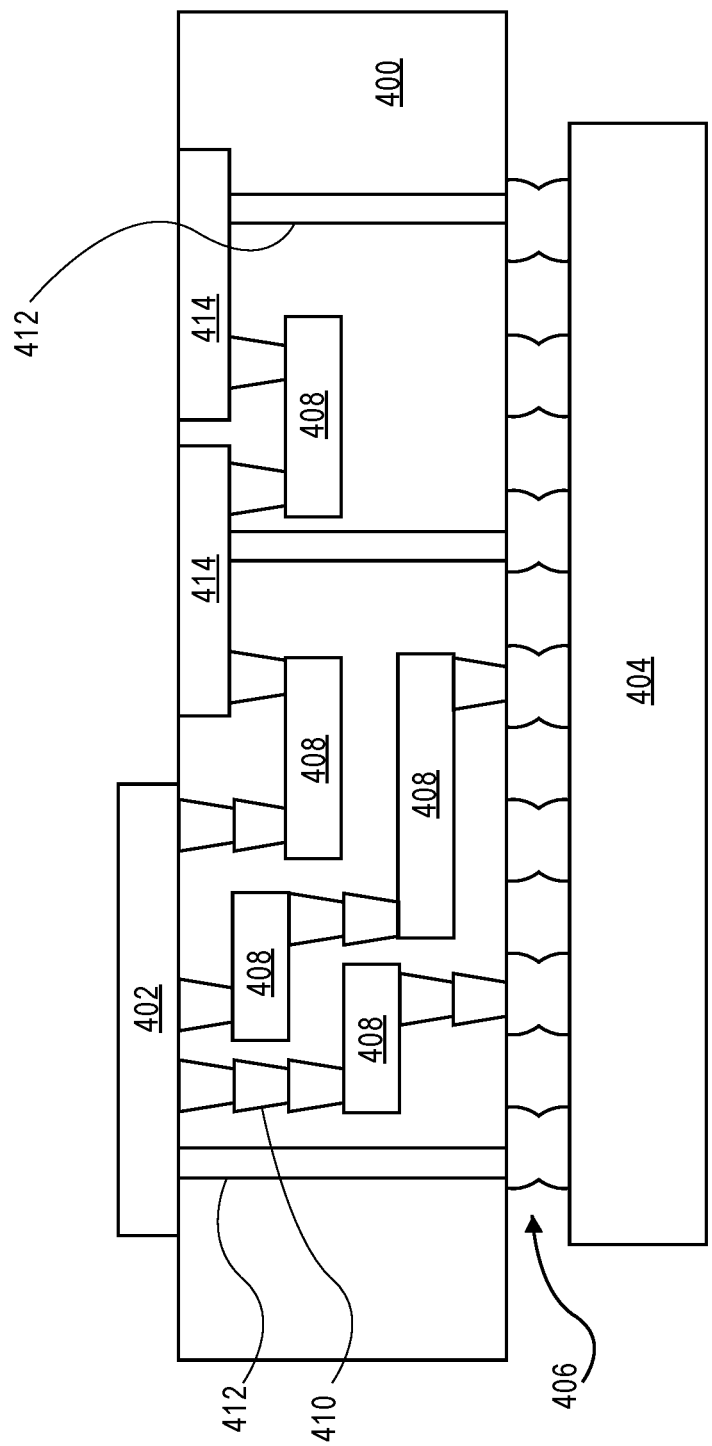
FIG. 4 illustrates an interposer that includes one or more embodiments of the disclosure.

FIG. 4 illustrates an interposer 400 that includes one or more embodiments of the disclosure. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400. In accordance with embodiments of the disclosure, apparatuses or processes disclosed herein may be used in the fabrication of interposer 400.

Thus, embodiments described herein include group III-V semiconductor fuses and their methods of fabrication.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

A fuse includes a gallium nitride layer on a substrate. An oxide layer is disposed in a trench in the gallium nitride layer. A first contact is on the gallium nitride layer on a first side of the trench, the first contact comprising indium, gallium and nitrogen. A second contact is on the gallium nitride layer on a second side of the trench, the second side opposite the first side, the second contact comprising indium, gallium and nitrogen. A filament is over the oxide layer in the trench, the filament coupled to the first contact and to the second contact wherein the filament comprises indium, gallium and nitrogen.

Example Embodiment 2

The fuse of example embodiment 1 further comprising a polycrystalline seed layer on the oxide layer in the trench, wherein the filament is on the polycrystalline seed layer.

Example Embodiment 3

The fuse of example embodiment 1 or 2, further comprising a first sidewall spacer between the first contact and the polycrystalline seed layer, the first sidewall spacer on the first side of the trench, and a second sidewall spacer between the second contact and the polycrystalline seed layer, the second sidewall spacer on the second side of the trench.

Example Embodiment 4

The fuse of example embodiment 1, 2 or 3, wherein the first contact, the second contact and the filament have an N+ conductivity.

Example Embodiment 5

The fuse of example embodiment 1, 2, 3 or 4, wherein the filament is polycrystalline.

Example Embodiment 6

The fuse of example embodiment 1, 2, 3, 4 or 5, wherein a polarization layer is on the gallium nitride layer on the first side of the trench and beneath the first sidewall spacer and wherein the polarization layer is on the gallium nitride layer on the second side of the trench and beneath the second sidewall spacer.

Example Embodiment 7

The fuse of example embodiment 1, 2, 3, 4, 5 or 6, wherein the oxide layer is a shallow trench oxide layer.

Example Embodiment 8

An integrated circuit structure includes a fuse. The fuse includes a gallium nitride layer on a substrate. An oxide layer is disposed in a trench in the gallium nitride layer. A first contact is on the gallium nitride layer on a first side of the trench, the first contact comprising indium, gallium and nitrogen. A second contact is on the gallium nitride layer on a second side of the trench, the second side opposite the first side, the second contact comprising indium, gallium and nitrogen. A filament is over the oxide layer in the trench, the filament coupled to the first contact and to the second contact wherein the filament comprises indium, gallium and nitrogen. The integrated circuit structure includes also includes a transistor. The transistor includes a polarization layer on the gallium nitride layer, a gate structure on the on the polarization layer, a source region on the gallium nitride layer on a first side of the gate structure, the source region comprising indium, gallium and nitrogen, and a drain region on a gallium nitride layer on a second side of the gate structure, the second side opposite the first side, the drain region comprising indium, gallium and nitrogen.

Example Embodiment 9

The integrated circuit structure of claim 8, wherein the fuse is part of a circuit which provides a predetermined bias voltage to the transistor depending upon a state of the fuse.

Example Embodiment 10

The integrated circuit structure of claim 8 or 9, wherein the transistor is electrically coupled to the fuse.

Example Embodiment 11

The integrated circuit structure of claim 8, 9 or 10, wherein the gate stack comprises a gate dielectric on the polarization layer, and a gate electrode on the gate dielectric.

Example Embodiment 12

A method of forming a fuse includes forming a trench in a gallium nitride layer on a substrate, filling the trench with an oxide layer, forming a first contact layer on the gallium nitride layer on a first side of the trench, and forming a second contact layer on the gallium nitride layer on a second side of the trench, the second side opposite the first side, wherein the first contact and the second contact comprise indium, gallium and nitrogen, and forming a filament above the oxide layer, the filament in contact with the first contact and the second contact, wherein the filament comprises indium, gallium and nitrogen.

Example Embodiment 13

The method of example embodiment 12, further comprising forming a polycrystalline seed layer on the oxide layer, and forming the filament on the polycrystalline seed layer.

Example Embodiment 14

The method of example embodiment 13, further comprising forming a first spacer on a first side of the polycrystalline seed layer and a second spacer on a second side of the polycrystalline seed layer.

Example Embodiment 15

The method of example embodiment 14, further comprising while forming the polycrystalline seed layer, forming a sacrificial polycrystalline gate above the gallium nitride layer.

Example Embodiment 16

The method of example embodiment 15, further comprising while forming the first spacer and the second spacer, forming a third spacer and fourth spacer on opposite sides of the sacrificial polycrystalline gate.

Example Embodiment 17

The method of example embodiment 12, 13, 14, 15 or 16, further comprising doping the first contact, the second contact and the filament with an n-type dopant to an N+ conductivity.

Example Embodiment 18

The method of example embodiment 12, 13, 14, 15, 16 or 17, further comprising forming a polarization layer on the gallium nitride layer prior to forming the trench.

Example Embodiment 19

The method of example embodiment 12, 13, 14, 15, 16, 17 or 18, further comprising while forming the first contact and the second contact, forming a source region and drain region on the gallium nitride layer, the source region and the drain region comprising indium, gallium and nitrogen.

Example Embodiment 20

The method of example embodiment 12, 13, 14, 15, 16, 17, 18 or 19, wherein the filament is a polycrystalline layer.

Example Embodiment 21

The method of example embodiment 20, wherein the filament is formed by MOCVD.

Example Embodiment 22

A fuse includes a first III-V semiconductor layer on a substrate. An oxide layer is disposed in a trench in the first III-V semiconductor layer. A first contact is on the first III-V semiconductor layer on a first side of the trench, the first contact comprising a second III-V semiconductor layer. A second contact is on the first III-V semiconductor layer on a second side of the trench, the second side opposite the first side, the second contact comprising the second III-V semiconductor layer. A filament is over the oxide layer in the trench, the filament coupled to the first contact and to the second contact wherein the filament comprises the second III-V semiconductor layer.

Example Embodiment 23

The fuse of example embodiment 22 further comprising a polycrystalline seed layer on the oxide layer in the trench, wherein the filament is on the polycrystalline seed layer.

Example Embodiment 24

The fuse of example embodiment 22 or 23, further comprising a first sidewall spacer between the first contact and the polycrystalline seed layer, the first sidewall spacer on the first side of the trench, and a second sidewall spacer between the second contact and the polycrystalline seed layer, the second sidewall spacer on the second side of the trench.

Example Embodiment 25

The fuse of example embodiment 22, 23 or 24, wherein the first contact, the second contact and the filament have an N+ conductivity.

What is claimed is:

1. A fuse comprising:
a gallium nitride layer on a substrate;
an oxide layer disposed in a trench in the gallium nitride layer;
a first contact on the gallium nitride layer on a first side of the trench, the first contact comprising indium, gallium and nitrogen;
a second contact on the gallium nitride layer on a second side of the trench, the second side opposite the first side, the second contact comprising indium, gallium and nitrogen; and
a filament over the oxide layer in the trench, the filament coupled to the first contact and to the second contact wherein the filament comprises indium, gallium and nitrogen.

2. The fuse of claim 1 further comprising a polycrystalline seed layer on the oxide layer in the trench, wherein the filament is on the polycrystalline seed layer.

3. The fuse of claim 1 further comprising a first sidewall spacer between the first contact and the polycrystalline seed layer, the first sidewall spacer on the first side of the trench, and a second sidewall spacer between the second contact and the polycrystalline seed layer, the second sidewall spacer on the second side of the trench.

4. The fuse of claim 1 wherein the first contact, the second contact and the filament have an N+ conductivity.

5. The fuse of claim 1 wherein the filament is polycrystalline.

6. The fuse of claim 1 wherein a polarization layer is on the gallium nitride layer on the first side of the trench and beneath the first sidewall spacer and wherein the polarization layer is on the gallium nitride layer on the second side of the trench and beneath the second sidewall spacer.

7. The fuse of claim 1 wherein the oxide layer is a shallow trench oxide layer.

8. An integrated circuit structure comprising:
a fuse comprising:
a gallium nitride layer on a substrate;
an oxide layer disposed in a trench in the gallium nitride layer;
a first contact on the gallium nitride layer on a first side of the trench, the first contact comprising indium, gallium and nitrogen;
a second contact on the gallium nitride layer on a second side of the trench, the second side opposite the first side, the second contact comprising indium, gallium and nitrogen; and
a filament over the oxide layer in the trench, the filament coupled to the first contact and to the second contact wherein the filament comprises indium, gallium and nitrogen; and
a transistor comprising:
a polarization layer on the gallium nitride layer;
a gate structure on the on the polarization layer;
a source region on the gallium nitride layer on a first side of the gate structure, the source region comprising indium, gallium and nitrogen;
a drain region on the gallium nitride layer on a second side of the gate structure, the second side opposite the first side, the drain region comprising indium, gallium and nitrogen.

9. The integrated circuit structure of claim 8 wherein the fuse is part of a circuit which provides a predetermined bias voltage to the transistor depending upon a state of the fuse.

10. The integrated circuit structure of claim 8 wherein the transistor is electrically coupled to the fuse.

11. The integrated circuit structure of claim 8 wherein the gate stack comprises a gate dielectric on the polarization layer, and a gate electrode on the gate dielectric.

12. A method of forming a fuse comprising:
forming a trench in a gallium nitride layer on a substrate;
filling the trench with an oxide layer;
forming a first contact layer on the gallium nitride layer on a first side of the trench, and forming a second contact layer on the gallium nitride layer on a second side of the trench, the second side opposite the first side, wherein the first contact and the second contact comprise indium, gallium and nitrogen; and
forming a filament above the oxide layer, the filament in contact with the first contact and the second contact, wherein the filament comprises indium, gallium and nitrogen.

13. The method of claim 12 further comprising forming a polycrystalline seed layer on the oxide layer, and forming the filament on the polycrystalline seed layer.

14. The method of claim 13 further comprising forming a first spacer on a first side of the polycrystalline seed layer and a second spacer on a second side of the polycrystalline seed layer.

15. The method of forming a fuse of claim 14 further comprising;
while forming the polycrystalline seed layer, forming a sacrificial polycrystalline gate above the gallium nitride layer.

16. The method of forming a fuse of claim 15 further comprising;
while forming the first spacer and the second spacer, forming a third spacer and fourth spacer on opposite sides of the sacrificial polycrystalline gate.

17. The method of claim 12, further comprising doping the first contact, the second contact and the filament with an n-type dopant to an N+ conductivity.

18. The method of claim 12 further comprising forming a polarization layer on the gallium nitride layer prior to forming the trench.

19. The method of forming a fuse of claim 12 further comprising;
while forming the first contact and the second contact, forming a source region and drain region on the gallium nitride layer, the source region and the drain region comprising indium, gallium and nitrogen.

20. The method of claim 12 wherein the filament is a polycrystalline layer.

21. The method of claim 20 wherein the filament is formed by MOCVD.

22. A fuse comprising:
a first III-V semiconductor layer on a substrate;
an oxide layer disposed in a trench in the first III-V semiconductor layer;
a first contact on the first III-V semiconductor layer on a first side of the trench, the first contact comprising a second III-V semiconductor layer;
a second contact on the first III-V semiconductor layer on a second side of the trench, the second side opposite the first side, the second contact comprising the second III-V semiconductor layer; and
a filament over the oxide layer in the trench, the filament coupled to the first contact and to the second contact wherein the filament comprises the second III-V semiconductor layer.

23. The fuse of claim 22 further comprising a polycrystalline seed layer on the oxide layer in the trench, wherein the filament is on the polycrystalline seed layer.

24. The fuse of claim 22 further comprising a first sidewall spacer between the first contact and the polycrystalline seed layer, the first sidewall spacer on the first side of the trench, and a second sidewall spacer between the second contact and the polycrystalline seed layer, the second sidewall spacer on the second side of the trench.

25. The fuse of claim 22 wherein the first contact, the second contact and the filament have an N+ conductivity.

* * * * *